US012286703B2

(12) United States Patent
Buschbeck et al.

(10) Patent No.: US 12,286,703 B2
(45) Date of Patent: Apr. 29, 2025

(54) EVAPORATION APPARATUS, VAPOR DEPOSITION APPARATUS, AND EVAPORATION METHOD

(71) Applicant: Applied Materials, Inc., Santa Clara, CA (US)

(72) Inventors: Wolfgang Buschbeck, Hanau (DE); Stefan Bangert, Steinau (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/542,356

(22) Filed: Dec. 15, 2023

(65) Prior Publication Data

US 2024/0117484 A1 Apr. 11, 2024

Related U.S. Application Data

(63) Continuation of application No. 17/024,882, filed on Sep. 18, 2020, now abandoned.

(51) Int. Cl.
*C23C 14/24* (2006.01)
*C23C 14/14* (2006.01)
*C23C 14/56* (2006.01)

(52) U.S. Cl.
CPC .............. *C23C 14/24* (2013.01); *C23C 14/14* (2013.01); *C23C 14/243* (2013.01); *C23C 14/246* (2013.01); *C23C 14/562* (2013.01)

(58) Field of Classification Search
CPC ................. C23C 14/243; C23C 14/246; C23C 14/24–325
See application file for complete search history.

(56) References Cited

U.S. PATENT DOCUMENTS

| 6,578,596 | B1 | 6/2003 | Batchelder et al. |
| 2006/0249699 | A1 | 11/2006 | Bowering et al. |
| 2010/0196623 | A1 | 8/2010 | Honda et al. |
| 2013/0276706 | A1 | 10/2013 | Lee et al. |
| 2014/0127406 | A1* | 5/2014 | Banaszak ............. C23C 14/562 118/724 |

(Continued)

FOREIGN PATENT DOCUMENTS

| CN | 1950541 | 4/2007 |
| CN | 1950541 A | 4/2007 |

(Continued)

OTHER PUBLICATIONS

English translation of KR10-1713112.*

(Continued)

*Primary Examiner* — Aiden Lee
(74) *Attorney, Agent, or Firm* — Lee & Hayes, P.C.

(57) ABSTRACT

An evaporation apparatus is described, particularly for evaporating a reactive material such as lithium. The evaporation apparatus includes an evaporation crucible for evaporating a liquid material, a material conduit for supplying the liquid material to the evaporation crucible, and a valve configured to close the material conduit by solidifying a part of the liquid material in the material conduit with a cooling device. The valve may include a cooling gas supply for a cooling gas, and the cooling device may be configured to cool the liquid material with the cooling gas. Further described are a vapor deposition apparatus for coating a substrate as well as an evaporation method.

10 Claims, 4 Drawing Sheets

(56) References Cited

U.S. PATENT DOCUMENTS

2016/0002789 A1    1/2016   Kontani et al.

FOREIGN PATENT DOCUMENTS

| | | |
|---|---|---|
| JP | 2002-150552 | 5/2002 |
| JP | 2002-150552 A | 5/2002 |
| KR | 101713112 | 3/2017 |
| KR | 101713112 B1 | 3/2017 |
| TW | 202012662 | 4/2020 |
| TW | 202012662 A | 4/2020 |
| WO | 2005116290 | 12/2005 |
| WO | 2005116290 A1 | 12/2005 |
| WO | 2012-095489 | 7/2012 |
| WO | 2012-095489 A1 | 7/2012 |
| WO | WO-2021013326 A1 * | 1/2021 |

OTHER PUBLICATIONS

International Search Report and Written Opinion, PCT/US2021/048677, Dec. 28, 2021.
Taiwan Office Action dated Jun. 10, 2022 for Application No. 110132012 (44018276TW).
Taiwan Office Action dated Dec. 2, 2022 for Application No. 110132012 (APPM/44018276TW01).
Taiwan Office Action dated Sep. 28, 2023 for Application No. 110132012 (44018276TW01).
Taiwan Office Action dated Sep. 23, 2024 for Application No. 110132012 (44018276TW01).

* cited by examiner

EVAPORATION APPARATUS, VAPOR DEPOSITION APPARATUS, AND EVAPORATION METHOD

CROSS-REFERENCE TO RELATED APPLICATIONS

This application is a continuation of co-pending U.S. patent application Ser. No. 17/024,882, filed. Sep. 18, 2020, which is herein incorporated by reference.

TECHNICAL FIELD

Embodiments of the present disclosure relate to substrate coating by thermal evaporation in a vacuum chamber. Embodiments particularly relate to substrate coating by evaporating a reactive material, such as an alkali metal or an alkaline earth metal, for example lithium. Specifically, embodiments relate to an evaporation apparatus for evaporating a liquid material, a vapor deposition apparatus with an evaporation apparatus, and an evaporation method.

BACKGROUND

Various techniques are known for depositing a layer on a substrate, for example, chemical vapor deposition (CVD) and physical vapor deposition (PVD). For coating a substrate at high deposition rates, thermal evaporation may be used as a PVD process. For thermal evaporation, a source material is heated and evaporated to produce a vapor that may be directed onto the substrate for coating the substrate. The temperature for achieving high deposition rates depends on the source material physical properties, e.g. vapor pressure as a function of temperature, and substrate physical limits, e.g., melting point.

For example, the source material to be deposited on the substrate is heated in an evaporation crucible to produce vapor at an elevated vapor pressure. The vapor can stream from the evaporation crucible to a heated vapor distributor with a plurality of nozzles. The vapor may be directed by the plurality of nozzles onto a surface of the substrate that is provided in a vacuum chamber to deposit a coating on the substrate.

Modern thin film lithium batteries may include a lithium coating. The lithium coating is formed, for example, through the deposition of lithium in a vapor state on the substrate. Since lithium is highly reactive, a plurality of measures needs to be addressed to operate and maintain such vapor deposition systems without the risk of safety hazards.

For alkali and alkaline earth metals, some deposition methods are not so amenable to high volume and low-cost manufacturing, because the methods have serious challenges in managing the high reactivity of such materials while scaling to high volume production. This presents challenges in producing uniformly deposited pure lithium. Lithium is of particular interest since lithium is suitable for the production of high energy density batteries and accumulators, i.e. primary batteries and secondary batteries. However, lithium is difficult to handle, e.g. it is challenging to transport, melt and evaporate lithium in a vacuum system, to control a flow rate thereof, and to clean and service the involved components, due to the high reactivity of lithium.

Evaporation methods for lithium are also challenging because it is difficult to quickly shut down or interrupt the evaporation process, for example for maintenance or other evaporation breaks, and the remaining lithium in the vapor deposition apparatus may entail a risk of chemically reacting with other materials. Specifically, common closing valves may not be suitable for controlling or interrupting a supply of reactive hot materials such as liquid lithium.

In view of the above, it would be beneficial to provide an improved evaporation apparatus, an improved vapor deposition apparatus, and an improved evaporation method that are suitable also for the evaporation of reactive materials, such as lithium, with a lower safety risk and that facilitate an easier maintenance and service of such apparatuses.

SUMMARY

In light of the above, an evaporation apparatus, a vapor deposition apparatus, and an evaporation method according to the independent claims are provided. Further aspects, advantages and features of the present disclosure are apparent from the description and the accompanying drawings.

According to one aspect, an evaporation apparatus is provided. The evaporation apparatus includes an evaporation crucible for evaporating a liquid material, a material conduit for supplying the liquid material to the evaporation crucible, and a valve configured to close the material conduit by solidifying a part of the liquid material in the material conduit with a cooling device.

In some embodiments, the valve includes a cooling gas supply for guiding a cooling gas, particularly an inert gas, to the cooling device, and the cooling device is configured to cool the liquid material with the cooling gas. In particular, the cooling device may be a heat exchanger for transferring heat of the liquid material to the cooling gas for freezing the liquid material, i.e. for transforming the state of the liquid material from liquid to solid. The valve may therefore also be referred to as a freeze valve. Specifically, the valve may be a cooling gas freeze valve.

According to one aspect, an evaporation apparatus is provided. The evaporation apparatus includes an evaporation crucible, a material conduit connected to the evaporation crucible, and a valve configured to close the material conduit by cooling the material conduit with a cooling gas, particularly with a noble gas, more particularly argon.

According to one aspect, a vapor deposition apparatus for coating a substrate is provided. The vapor deposition apparatus includes an evaporation apparatus according to any of the embodiments described herein. The vapor deposition apparatus further includes a vapor distributor with a plurality of nozzles for directing material evaporated in the evaporation crucible toward the substrate, and a movable substrate support, particularly a coating drum, for moving the substrate past the vapor distributor.

According to one aspect, an evaporation method is provided. The evaporation method includes guiding a liquid material through a material conduit into an evaporation crucible, evaporating the liquid material in the evaporation crucible, and closing the material conduit by solidifying a part of the liquid material in the material conduit.

The part of the liquid material may be solidified through cooling with a cooling gas, particularly a noble gas such as argon.

According to one aspect, a method of manufacturing a coated substrate, particularly including an anode of a lithium battery is provided. The method includes transporting a substrate in a vapor deposition apparatus, particularly in a vapor deposition apparatus according to any of the embodiments described herein. The substrate may be a flexible substrate that is supported on a rotating coating drum in a vacuum chamber. The method further includes guiding a liquid material through a material conduit into an evaporation crucible, evaporating the liquid material in the evaporation crucible, guiding the evaporated material from the evaporation crucible through a vapor conduit into a vapor distributor, and directing the evaporated material from the vapor distributor through a plurality of vapor nozzles toward the substrate for coating the substrate. At least one of the material conduit and the vapor conduit may be closed through cooling with a cooling gas, such that the liquid material and/or the vapor solidifies and clogs the respective conduit.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for manufacturing the described apparatuses and products, and methods of operating the described apparatuses. Described embodiments include method aspects for carrying out every function of the described apparatuses.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations. Unless specified otherwise, the description of a part or aspect in one embodiment applies to a corresponding part or aspect in another embodiment as well.

According to embodiments of the present disclosure, apparatuses and methods for coating by evaporation in a vacuum chamber are provided. For coating a substrate with a source material by evaporation, the source material may be heated inside an evaporation apparatus, e.g. inside an evaporation crucible of the evaporation apparatus, above the evaporation temperature of the source material. The evaporated material may then be guided in a vapor distributor toward a plurality of nozzles for directing the evaporated material toward the substrate. A material coating can be deposited on the substrate. In some embodiments, the substrate may be a flexible substrate, e.g. a web or foil.

Figure 1:
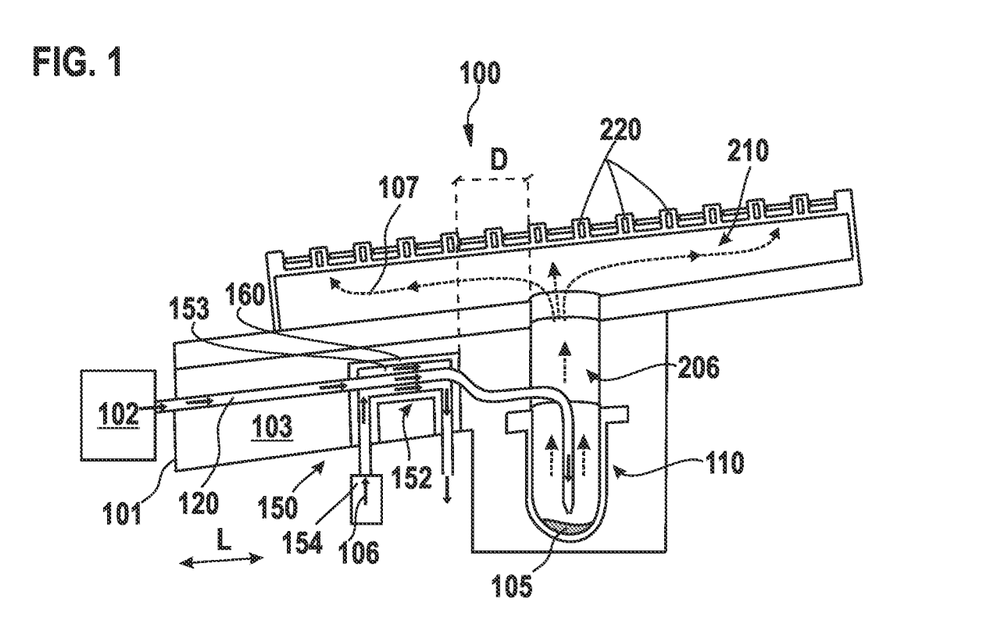
FIG. 1 shows a schematic view of an evaporation apparatus according to embodiments of the present disclosure.

FIG. 1 shows an evaporation apparatus 100 according to embodiments described herein. The evaporation apparatus 100 includes an evaporation crucible 110 for evaporating a liquid material 105, and a material conduit 120 for supplying the liquid material into the evaporation crucible 110. Accordingly, the source material to be evaporated may be supplied to the evaporation crucible 110 in a liquid state, i.e. at a temperature above a inciting point temperature of the source material. For example, the source material may be heated in a material heater 102 to change from a solid state to a liquid state and may then be guided toward the evaporation crucible 110 through the material conduit 120. The material conduit 120 may be a tube, e.g. a tube made of a suitable metal, e.g. steel or titanium. The material conduit 120 may extend through a heatable enclosure or chamber 101 that can be heated to an elevated temperature, such that the liquid material 105 remains in the liquid state when flowing in the material conduit 120 through the heatable closure or chamber 101 toward the evaporation crucible 110.

The liquid material 105 may be heated in the evaporation crucible 110 to a temperature above the evaporation temperature of the liquid material. The liquid material 105 evaporates in the evaporation crucible to form an evaporated material 107 that may be guided through a vapor conduit 206 into a vapor distributor 210 with a plurality of nozzles 220 for directing the evaporated material 107 toward the substrate to be coated.

In the following, one or more evaporation concepts will be described for lithium as a source material to be evaporated. According to some embodiments, which can be combined with other embodiments described herein, the evaporation concepts may also be applicable to other source materials. Particularly, the evaporation concepts may be applicable to highly reactive materials, for example, alkali metals or alkaline earth metals. Further, the evaporation concepts may be beneficially used for high deposition rates resulting in layer thicknesses on the substrate of a few microns or above, particularly in a roll-to-roll coating apparatus ("R2R coater").

In some embodiments, the evaporation apparatus 100 is configured for flash evaporation. In particular, the evaporation crucible 110 may be configured for flash evaporation and may be self-regulating with respect to the fill height of the evaporation crucible at a predetermined amount of material evaporated. Alternatively or additionally, a flow meter may be connected to the material conduit 120 for measuring a flow of the liquid material, and/or a regulation valve having a regulating element can be provided at the material conduit (not shown in FIG. 1).

In a flash evaporator, there is only a small amount of liquid material in the evaporation crucible, which is evaporated in a very short time ("flash evaporation"). The liquid material 105 may be continuously fed into the crucible through the material conduit, for example, by a dosing pump, particularly at a small flow rate. For flash evaporation, the evaporation rate may be controlled by the amount of liquid material supplied to the evaporation crucible, for example, by the amount of liquid material provided by the dosing pump and/or the flow rate of the liquid material into the evaporation crucible. The evaporation rate may not be controlled by the temperature of the evaporation crucible.

In other embodiments, the evaporation crucible 110 may be a crucible in which a larger amount of liquid material to be evaporated can be accommodated. Here, the evaporation rate may (also) be controlled by adjusting the temperature in the evaporation crucible. The liquid material may be supplied to the evaporation crucible 110 through the material conduit 120 continuously or in intervals, e.g. when the liquid material in the evaporation crucible falls below a predetermined amount. In any case, a small amount of liquid material in the evaporation crucible at a time may be beneficial in view of the high reactivity of the material.

For stopping the material evaporation in the evaporation crucible, the material conduit may be closed with a closing valve. For example, stopping the material supply through the material conduit may be beneficial for maintenance purposes, for cleaning purposes, and/or for a temporary interruption or break of the material deposition on the substrate. However, conventional closing valves for liquid materials may not be suitable for closing material conduits with highly reactive materials. For example, the closing elements of conventional valves may be corroded by the liquid material, or there may be a risk of chemical reactions between the liquid material and components of the valve that may come in contact with the liquid material, leading to fire or explosion.

According to embodiments described herein, the evaporation apparatus 100 includes a valve 150 that is suitable for closing the material conduit 120, even if a highly reactive liquid material flows through the material conduit 120. The valve 150 is configured to close the material conduit 120 by solidifying a part of the liquid material in the material conduit 120 with a cooling device 152.

In other words, the valve 150 includes a cooling device 152 that is configured to cool the liquid material in the material conduit 120 to a temperature below a melting point temperature of the liquid material, such that a part of the liquid material solidifies (or "freezes") and thus clogs the material conduit 120 for the incoming liquid material. The solidified part of the material in the material conduit 120 hence constitutes a plug for the liquid material upstream of the solidified material and blocks the material conduit. Accordingly, the valve 150 may be referred to as a "freeze valve" that closes the material conduit 120 by freezing a part of the liquid material flowing through the material conduit.

Freeze valves typically use a liquid cooling medium to stop a flow of a liquid material in a material conduit by freezing the liquid material. A liquid cooling medium, such as water or oil, has the advantage that a liquid cooling medium can transport away large thermal loads and can therefore quickly cool down and freeze a material within a small cooling interaction area. However, liquid cooling media may have serious issues in a hot environment, especially in the vicinity of reactive materials such as lithium. At high temperatures, e.g. above the melting point, alkaline metals are extremely reactive with liquids, such as water and even oil, causing a risk of fire and explosion hazards.

In order to reduce or avoid the above risks, the cooling device 152 of the valve 150 of embodiments described herein may use a cooling gas 106 for the cooling and freezing of the liquid material in the material conduit 120, particularly a noble gas, more particularly argon.

In some embodiments, which can be combined with other embodiments described herein, the valve 150 comprises a cooling gas supply 154 for guiding the cooling gas 106 to the cooling device 152, and the cooling device 152 is configured to cool the liquid material with the cooling gas 106. In particular, the cooling device 152 may be a heat exchanger configured to transfer heat from the liquid material to the cooling gas 106, such that the liquid material is cooled down in the material conduit 120 to a temperature below the melting temperature and solidifies in the material conduit 120.

In some embodiments, the cooling gas supply 154 may be a noble gas supply, particularly an argon supply. Argon is a suitable cooling gas for cooling reactive materials, particularly reactive metals such as lithium, even in high temperature environments. The risk of chemical reactions between noble gases and reactive liquid materials is low or even negligible, such that the cooling gas can be arranged close to the material conduit 120, and even at a position close to the evaporation crucible 110, without a risk of fire or explosions.

For example, the cooling gas supply 154 may include a cooling gas source, e.g. a gas cylinder or another gas reservoir, and/or a gas supply line or tube for supplying the cooling gas into a heatable environment, particularly a heatable enclosure or chamber 101, in which the material conduit 120 may be arranged. The cooling gas supply 154 may supply the cooling gas 106 to the cooling device 152 that is arranged in thermal contact with the material conduit 120, such that the liquid material flowing through the material conduit 120 can reliably be cooled with the cooling gas 106.

In some embodiments, the cooling device 152 may be a heat exchanger with a cooling passage 153 for a cooling medium that at least partially surrounds the material conduit 120 for cooling the liquid material in the material conduit 120. The cooling passage 153 may be in thermal contact with the material conduit 120 and may include a tube for guiding the cooling gas 106 along a section of the material conduit. In particular, the cooling passage 153 may be a tube for the cooling gas 106 that at least partially or entirely surrounds the material conduit 120 and extends along a section of the material conduit 120. For example, the extension of the cooling passage 153 in a length direction L of the material conduit 120 may be 5 cm or more, particularly 10 cm or more, and/or 30 cm or less.

Cooling a liquid material with a cooling gas may be more difficult as compared to cooling a liquid material with a cooling liquid, since the cooling power of gases is generally lower than the cooling power of liquids, such as water. Providing a cooling gas supply 154 with any of the following characteristics allows for a reliable cooling of the liquid material, particularly liquid lithium, with a cooling gas: The cooling gas supply 154 may be configured to guide the cooling gas 106 through the cooling passage 153 of the cooling device 152 with at least one of (i) a gas pressure in a range from 2 bar to 20 bar, particularly from 5 bar to 15 bar, more particularly about 10 bar, (ii) a gas velocity a range from 15 m/s to 50 m/s, particularly from 20 m/s to 30 m/s and (iii) a mass flow in a range from 10 slm to 50 slm (standard liter per minute), particularly from 15 slm to 25 slm, e.g. about 20 slm. In some embodiments, the volume flow of the cooling gas through the cooling passage may be from 2 l/min to 5 l/min, particularly from 2.5 μmin to 3 l/min. In one example, the cooling gas (e.g., argon) is supplied through the cooling passage at a pressure of about 10 bar with a volume flow of about 2.7 l/min, such that a mass flow of the cooling gas past the material conduit of about 20 slm is obtained.

The cooling gas supply 154 may be configured to supply the cooling gas to the cooling passage 153 with a temperature of 15° C. or more and 150° C. or less at a position upstream of the cooling passage 153 (a position of the cooling device 152 where the heat exchange between the cooling gas and the liquid material starts). For example, the cooling gas may be supplied at room temperature. Specifically, the cooling gas may be provided by a cooling gas supply configured to provide the cooling gas to the cooling device at room temperature.

The liquid material 105 may be a liquid metal having a temperature above the melting point temperature of the liquid metal at a position upstream of the cooling device 152 in the material conduit 120. The liquid metal may be liquid lithium having a melting point temperature of about 183° C. (the melting point temperature may depend on the pressure). The temperature of the liquid lithium in the material conduit 120 upstream of the cooling device 152 may be 200° or more, particularly 300° C. or more, or even 400° C. or more, and for 800° C. or less, particularly 700° C. or less, more particularly 600° C. or less.

In some embodiments, which can be combined with other embodiments described herein, the cooling device 152 is a heat exchanger with a cooling passage 153 that surrounds a section of the material conduit 120 and is in thermal contact with the material conduit 120.

The cooling passage 153 may extend annularly around a section of the material conduit 120. For example, a main flow direction of the cooling gas in the cooling passage 153 may essentially correspond to a main flow direction of the liquid material in the material conduit, or may be opposite thereto.

Figure 2:
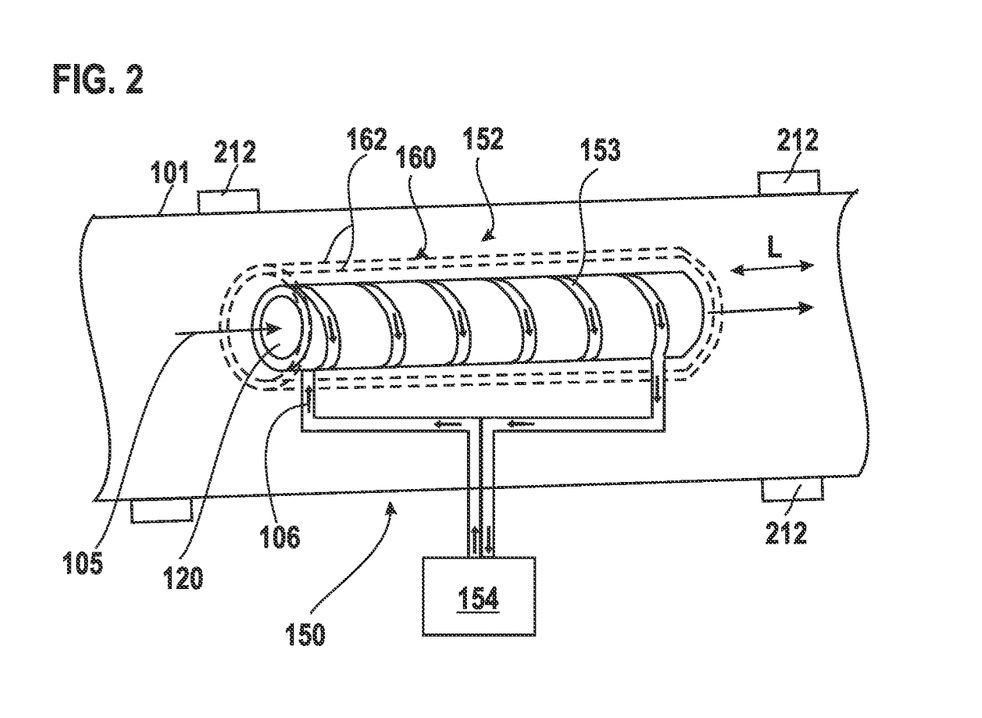
FIG. 2 shows a schematic view of a freeze valve of an evaporation apparatus according to embodiments of the present disclosure.

In some embodiments, the cooling passage 153 extends helically or spirally around the material conduit 120, as it is schematically depicted in FIG. 2. The cooling interaction area between the cooling gas and the liquid material can be increased by a helical extension of the cooling passage 153 around the material conduit while providing a predetermined cooling gas velocity in the cooling passage.

In some embodiments, a distance D between the cooling device 152 and the evaporation crucible 110 is 50 cm or less, particularly 30 cm or less, or even 20 cm or less. Accordingly, the cooling device 152 can be arranged at the material conduit 120 at a position close to the evaporation crucible 110. If the valve 150 is switched to a closed state by solidifying a part of the liquid material in the material conduit, only a small amount of liquid material remains in the material conduit between the cooling device and the evaporation crucible, such that the amount of reactive material in the apparatus after a closure of the valve can be kept low. This improves the security, e.g. in cases of maintenance breaks or service breaks of the system.

In some embodiments, which can be combined with other embodiments described herein, the evaporation apparatus 100 includes a heatable enclosure or chamber 101 through which the material conduit 120 extends. Optionally, also any of the evaporation crucible 110, the vapor conduit 206, and the vapor distributor 210 may be arranged inside said heatable enclosure or chamber 101. One or more heating elements may be provided for heating an inner volume 103 of the heatable enclosure or chamber 101. For example, the inner volume 103 of the heatable enclosure or chamber 101 can be heated to a temperature above the melting point temperature of the liquid material, e.g. to a temperature of 200° C. or more, 300° C. or more, or even 400° C. or more. This ensures that the liquid material 105 remains liquid when flowing through the material conduit 120 and the valve 150 is in an open state.

The cooling device 152 may be arranged at the material conduit 120 at a position inside the heatable enclosure or chamber 101, e.g. at a position close to the evaporation crucible 110. Specifically, the cooling passage 153 of the cooling device 152 may surround the material conduit 120 at a position inside the heatable enclosure or chamber 101. Accordingly, the cooling device 152 is arranged in an environment that is generally hot during the evaporation process, e.g. provided at a temperature of 300° C. or more. Other valve types may not be suitable for such hot environments. On the other hand, the freeze valve described herein, particularly the cooling gas freeze valve described herein, can be arranged at a material conduit in said hot environment of the heatable enclosure or chamber 101 without a risk of wear of a closing element of the valve. Further, there is no risk of a chemical reaction with a valve component, since, even in the closed state of the valve, there is no valve component in direct contact with the liquid material, and the risk of a chemical reaction between the liquid material and the cooling inert gas—if there would be any contact—is negligible, or there is no reaction risk at all.

In order to ensure a proper functioning of the freeze valve even in the hot environment of the heatable enclosure or chamber, a thermal insulation arrangement 160 may be provided. The thermal insulation arrangement 160 may partially or entirely enclose the cooling device 152 for thermally insulating the cooling device and a section of the material conduit surrounded by the cooling device from the hot environment inside the heatable enclosure or chamber 101. In particular, the cooling passage 153 of the cooling device 152 may be partially or entirely enclosed or surrounded by the thermal insulation arrangement 160.

Further, the part of the cooling gas supply 154 that is arranged inside the heatable enclosure or chamber 101 may be thermally insulated with respect to the inner volume 103 of the heatable enclosure or chamber 101 with the thermal insulation arrangement 160. For example, a cooling gas supply tube of the cooling gas supply 154 may be surrounded by a thermal insulation element, e.g. a heat shield.

In some embodiments, the thermal insulation arrangement 160 includes at least one heat shield that surrounds the section of the material conduit 120 at which the cooling device 152 is arranged and the cooling device 152. In particular, the thermal insulation arrangement 160 may include two or more tubularly shaped heat shields that may coaxially extend around the material conduit and at least partially or entirely enclose the cooling device.

In some embodiments, the evaporation crucible 110 is configured to evaporate a reactive material, particularly at least one of an alkali metal and an alkaline earth metal, more particularly lithium.

In some implementations described herein, the cooling device 152 is configured to cool at least a part of the liquid material in the material conduit 120 from a first temperature of 300° C. or more to a second temperature of 150° C. or less, particularly wherein the first temperature is above a melting point temperature and the second temperature is below the melting point temperature of the liquid material. The first temperature may be 400° C. or more, and/or the second temperature may be 150° C. or less.

In some embodiments, the valve 150 includes a cooling medium circuit for the cooling gas. Here, the cooling gas is supplied to the cooling device 152 with the cooling gas supply for cooling the liquid material, and the heated cooling gas downstream of the cooling device is cooled down again to be re-supplied to the cooling device. A closed cooling circuit for the cooling gas may be provided.

In other embodiments (as it is shown in FIG. 1), the cooling gas is supplied to the cooling device 152 with the cooling gas supply 154 for cooling the liquid material, and the heated cooling gas downstream of the cooling device 152 is emitted into the ambient air through an exhaust tube.

For example, if the cooling gas is a noble gas, such as argon, emitting the cooling gas into the ambient air downstream of the cooling device provides a cost-effective and compact closing valve.

Optionally, the evaporation apparatus may further include a flow meter for measuring a flow rate of the liquid material in the material conduit and/or a flow valve having a regulating element for regulating a flow of the liquid material through the material conduit for adjusting an evaporation rate in the evaporation crucible.

FIG. 2 is a schematic view of a valve 150 of an evaporation apparatus according to embodiments described herein. The evaporation apparatus may include some features or all the features of the evaporation apparatus 100 described above, such that reference can be made to the above explanations, which are not repeated here.

The evaporation apparatus includes an evaporation crucible (not depicted in FIG. 2) and a material conduit 120, particularly a material feeding tube, that is connected to the evaporation crucible, e.g. for supplying a liquid material 105 to the evaporation crucible. The evaporation apparatus further includes the valve 150 configured to close the material conduit 120 by cooling the material conduit 120 with a cooling gas 106. The valve 150 may be a freeze valve configured to close the material conduit by freezing a part of the material flowing through the material conduit.

The material conduit 120 may extend through a heatable enclosure or chamber 101 to the evaporation crucible. For example, a plurality of heaters 212 may be provided for heating an inner volume 103 of the heatable enclosure or chamber 101 to a temperature above a melting point temperature of the liquid material. In particular, the liquid material 105 flowing through the material conduit 120 may be lithium, and the beatable enclosure or chamber 101 may be heated during an evaporation process to a temperature above 200° C., particularly 300° C. or more, or even 400° C. or more.

The valve 150 may include a cooling gas supply 154 for guiding a cooling gas 106 to a cooling device 152. The cooling device 152 may be a heat exchanger with a cooling passage 153 that may surround a section of the material conduit 120 and that is in thermal contact with the material conduit 120. The heat exchanger may be configured to cool the liquid material 105 by transferring heat from the liquid material 105 to the cooling gas 106 in the cooling passage 153.

In some embodiments, the cooling passage 153 extends helically around the material conduit 120. For example, the cooling passage 153 includes three or more, or five or more tube windings extending around the material conduit 120. The cooling interaction volume can be increased by a helically shaped cooling passage 153. If a cooling gas is used for cooling, a large cooling interaction volume and a sufficiently high gas flow rate are beneficial because a cooling gas is generally less suitable with regard to removing heat than a cooling liquid. If a large interaction volume between the cooling passage and the material conduit and a suitable cooling passage cross-section and arrangement are provided, the liquid material can be reliably solidified through cooling with the cooling gas.

In some implementations, the cooling gas may be configured to remove a thermal energy of 20 Joule or more per second (cooling power=20 W or more), particularly 30 Joule or more per second (cooling power=30 W or more) from the liquid material. In some embodiments, the cooling gas mass flow through the cooling passage 153 may be in a range from 10 slm to 50 slm, particularly about 20 sim (20 slm corresponds to a volume flow of about 2.7 l/min at 10 bar and 100° C.). In some embodiments, the gas velocity in the cooling passage may be 15 m/s or more and 30 m/s or less. In some embodiments, the gas temperature upstream of the cooling passage may be 15° C. or more and 150° C. or less. The above parameter ranges turned out to be suitable for reliably solidifying a liquid material, particularly lithium, with a cooling gas, particularly argon.

In some embodiments, a thermal insulation arrangement 160 encloses the cooling device 152. The thermal insulation arrangement 160 may include two, three or more heat shields 162 that may be tubularly shaped and/or that may be configured for thermally insulating the cooling device 152 and/or the cooling gas supply 154 from the (hot) inner space of the heatable enclosure or chamber 101. The two, three or more heat shields 162 (indicated in dashed lines in FIG. 2) may coaxially extend around the material conduit and may at least partially or entirely enclose the cooling device. For example, three or more coaxially arranged heat shields may surround a section of the material conduit.

When a cooling gas feeding tube of the cooling gas supply 154 is then ally insulated, it can be avoided that the cooling gas 106 is excessively heated up in the hot environment of the heatable enclosure or chamber 101 through which the cooling gas feeding tube extends. When the thermal insulation arrangement 160 encloses the section of the material conduit at which the cooling device is arranged, it can be avoided that the material solidified by the cooling gas is melted in the hot environment inside the beatable enclosure or chamber 101, if the valve is in a closed state, i.e., when the cooling gas streams through the cooling passage for solidifying the liquid material.

The thermal insulation arrangement 160, particularly the two, three or more heat shields 162, may be in thermal contact with a heat sink outside the heatable enclosure or chamber 101, such that the heat load on the thermal insulation arrangement 160 can be conductively dissipated toward the heat sink. For example, the heat shields can conductively dissipate the heat via a metallic connection that supports the cooling gas supply.

In some embodiments, the length of the thermal insulation arrangement 160 along the material conduit 120 in the length direction L of the material conduit 120 is larger than the length of the cooling device 152 in the length direction L, e.g. by 50% or more. For example, the thermal insulation arrangement 160 may extend beyond one or both ends of the cooling device 152 in the length direction L by a distance of 4 cm or more, particularly 5 cm or more. Excessive heat radiation from the hot inner environment of the heatable enclosure or chamber 101 into the coolable section of the material conduit surrounded by the cooling device can be further reduced or avoided.

According to embodiments described herein, the valve 150 is switched from an open state to a closed state by supplying the cooling gas 106 through the cooling passage 153 of the cooling device 152 until a part of the liquid material in the material conduit 120 solidifies and clogs the material conduit 120.

The closed state can be maintained by continuously supplying the cooling gas 106 through the cooling passage 153 at a predetermined temperature, flow rate and/or gas pressure.

According to embodiments described herein, the valve 150 is switched from the closed state back to the open state by stopping the supply of the cooling gas 106 through the cooling passage 153. The hot environment inside the heatable enclosure or chamber 101 may provide sufficient heat for melting the solidified material in the material conduit, such that the material conduit is quickly re-opened, e.g. within a period of 10 seconds or less. In particular, no additional heating device for heating up the solidified material may be provided. Rather, the heaters 212 that are anyway provided for heating the heatable enclosure or chamber 101 may provide sufficient heat for melting the solidified material in the material conduit when the valve is in the open state, i.e. without a supply of cooling medium.

According to the embodiments described herein, a small and cost-competitive freeze valve for closing a material conduit of an evaporation apparatus is provided. The valve has a fast reaction time and can be mounted at the material conduit at a position close to the evaporation apparatus. The valve may be a cooling gas freeze valve, i.e., a freeze valve that uses a cooling gas as a cooling medium. A cooling gas freeze valve can also be used for closing a material conduit for guiding a highly reactive material, such as lithium. Potential safety hazards that relate to liquid cooling media are removed.

Figure 3:
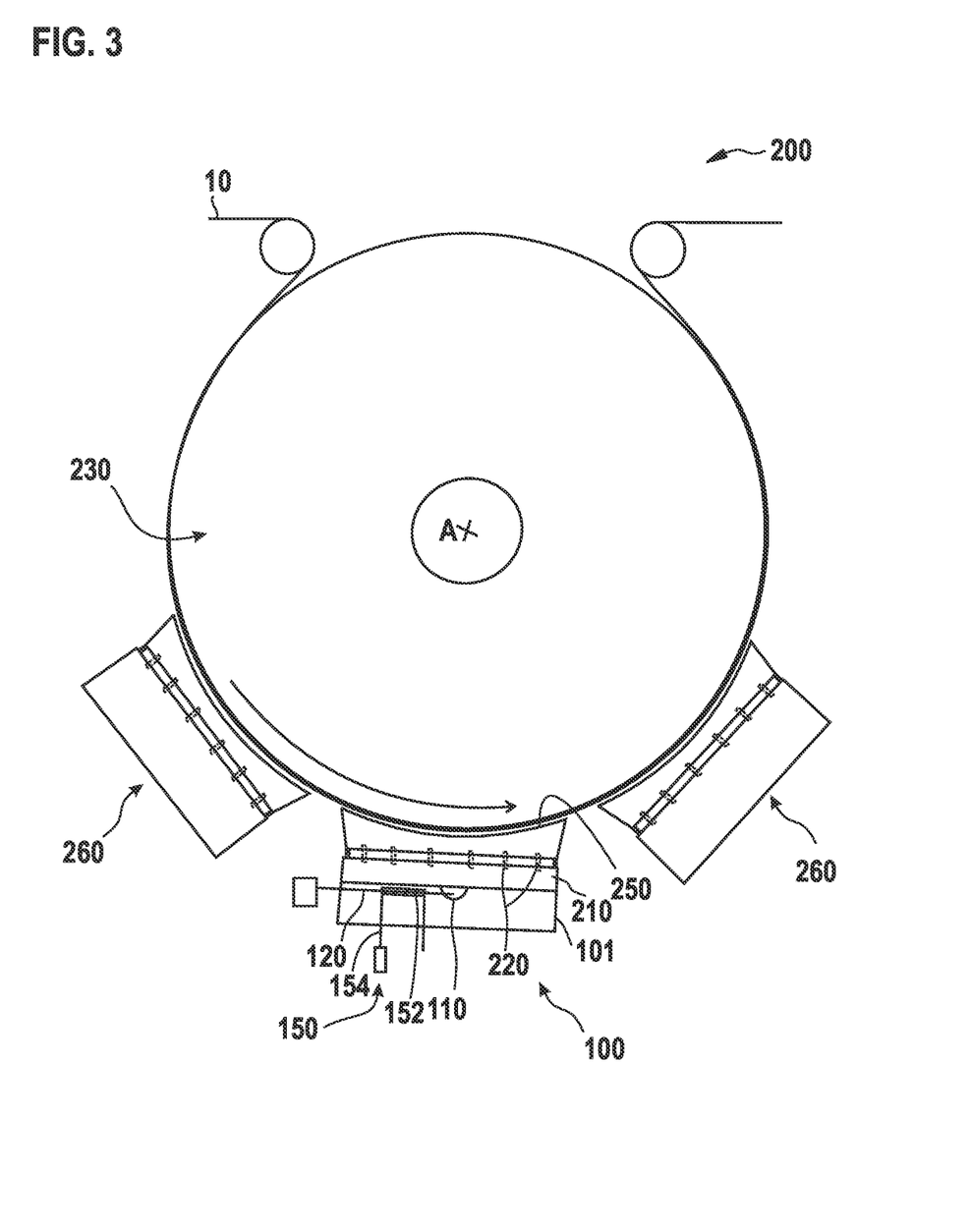
FIG. 3 shows a schematic view of a vapor deposition apparatus according to embodiments of the present disclosure.

FIG. 3 is a schematic view of a vapor deposition apparatus 200 for coating a substrate 10 according to embodiments described herein. The vapor deposition apparatus 200 includes an evaporation apparatus 100 according to any of the embodiments described herein, such that reference can be made to the above explanations, which are not repeated here.

The vapor deposition apparatus 200 further includes a vapor distributor 210 with a plurality of nozzles 220 for directing the material evaporated in the evaporation crucible 110 toward the substrate, and a movable substrate support, particularly a coating drum 230, for moving the substrate 10 past the vapor distributor 210.

The vapor deposition apparatus 200 may have a plurality of evaporation apparatuses that may be configured in accordance with the evaporation apparatus 100 described above, e.g., two, three or more evaporation apparatuses. In FIG. 3, two further evaporation apparatuses 260 are schematically depicted. The plurality of evaporation apparatuses may be arranged one after the other along a substrate transportation path, such that several layers of different coating materials or one thick layer of one coating material can be deposited on the substrate by the plurality of evaporation apparatuses. The plurality of evaporation apparatuses may be arranged along a periphery of the coating drum 230, such that the substrate 10 guided on the coating drum 230 can be subsequently coated by the plurality of evaporation apparatuses.

The vapor deposition apparatus 200 may be configured for coating a flexible substrate, such as a web of foil, in a R2R coater. The web may be guided by rollers on the coating drum 230. The coating drum 230 is rotatable around a rotation axis, as is indicated by the arrow, and moves the web through processing regions of the evaporation apparatuses. In some embodiments, the flexible substrate includes a metal foil, particularly a copper foil. Alternatively or additionally, the flexible substrate may include any of graphite, silicon, and silicon oxide.

The evaporation apparatuses and the coating drum are at least partially disposed within a vacuum deposition chamber (not shown in FIG. 3). The processing regions of the evaporation apparatuses are within the vacuum deposition chamber.

According to some embodiments, which can be combined with other embodiments described herein, a heatable shield 250 can be provided that extends at least partially from the evaporation apparatus 100 toward the coating drum 230 and defines a coating window of the evaporation apparatus 100.

The heatable shield 250 is heatable, such that vapor condensation on the heatable shield 250 can be reduced or prevented when the heatable shield is heated to an operation temperature, e.g. an operation temperature of 500° C. or more in some embodiments, such as 500° C. to 600° C. Preventing vapor condensation on the heatable shield is beneficial because cleaning efforts can be reduced. Further, a coating on the heatable shield 250 may change the dimensions of the coating window that is provided by the heatable shield. Further, source material utilization can be improved when no source material accumulates on the heatable shield. Vapor hitting the heatable shield 250 that is provided at the operation temperature may be immediately re-evaporated or reflected from the heatable shield surface, such that the respective vapor molecules end up on the substrate surface rather than on the heatable shield surface. Material accumulation on the heatable shield can be reduced or prevented, and cleaning efforts can be reduced.

The evaporation crucible, the vapor deposition apparatus, and the evaporation methods described herein may be particularly useful for depositing lithium. The lithium may be deposited on a thin web or foil to improve mass production of thin-film batteries.

Lithium may for example be deposited on a thin copper foil to generate an anode of a battery. Further, a layer including graphite and/or at least one of silicon and silicon oxide may be provided on a thin web or foil. The web or foil may further include a conductive layer or may consist of a conductive layer serving as a contact surface of the anode. Lithium deposited on the layer on the web may provide prelithiation of the layer including graphite and at least one of silicon and a silicon oxide.

For mass production, high deposition rates are beneficial. Yet, the webs or foils, particularly in a roll-to-roll deposition process are very thin. The heat transfer on the substrate is dominated by condensation energy of the evaporated material. Further, heat removal from the substrate in a vacuum process is dominated by heat conduction. Accordingly, the vapor deposition apparatus beneficially includes a coating drum configured to effectively remove heat from the substrate 10. For example, the coating drum 230 may be a gas cushion coating drum that is configured for providing a cooling gas between the drum surface and the substrate.

Figure 4:
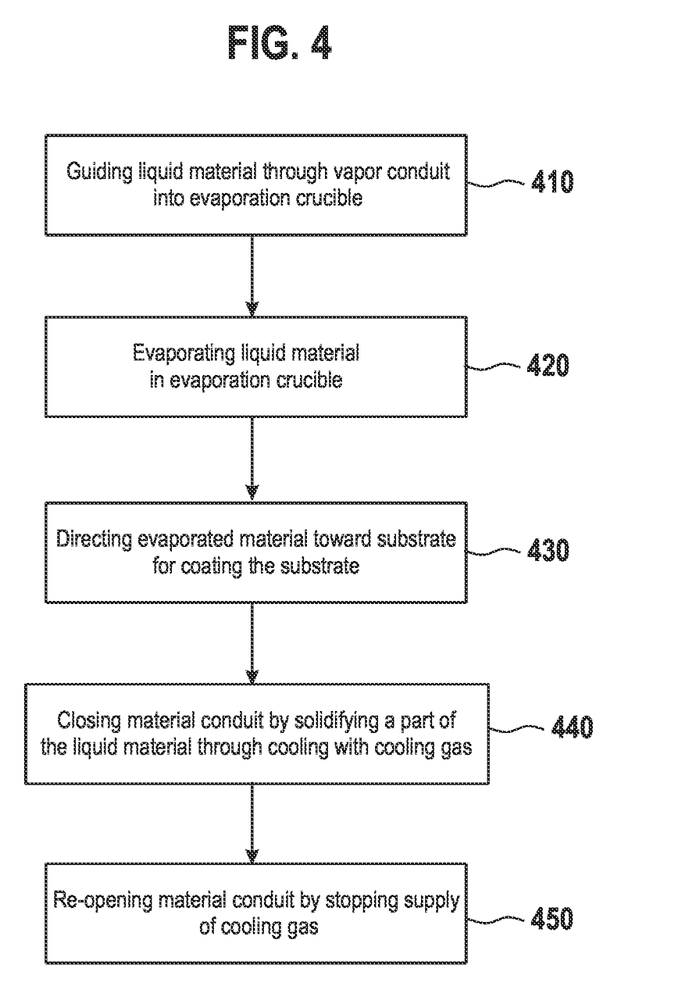
FIG. 4 shows a flowchart illustrating an evaporation method according to embodiments of the present disclosure.

FIG. 4 is a flow chart for illustrating an evaporation method according to embodiments described herein.

In box 410, a liquid material is guided through a material conduit into an evaporation crucible. The liquid material may be a reactive material, e.g. a reactive metal. In particular, the liquid material may be an alkali metal or an alkaline earth metal, particularly lithium. Before being guided through the material conduit, a solid source material may be heated in a material heater to a temperature above the melting point of the solid source material to provide the liquid material. Optionally, the liquid material may be pumped through the material conduit with a dosing pump.

In box 420, the liquid material is evaporated in the evaporation crucible to form an evaporated material. In particular, the liquid material is heated in the evaporation crucible to a temperature above the evaporation temperature of the source material.

Optionally, the evaporation crucible may be configured for a flash evaporation of the liquid material. The evaporation crucible may have one or more sidewalls, and a reservoir portion below the one or more sidewalls, the reservoir portion having a first cross-section of a first size and a second cross-section above the first cross-section of a second size, the second size being larger than the first size. The one or more sidewalls and the reservoir portion may be integrally formed, and/or the evaporation crucible may be at least partially made of steel, Mo, Ta or combinations thereof.

In box 430, the evaporated material is guided from the evaporation crucible through a vapor conduit into a vapor distributor and directed from the vapor distributor through a plurality of vapor nozzles toward a substrate for coating a substrate in a vacuum chamber. The substrate may be a flexible substrate that is moved on a coating drum past the vapor distributor during the coating.

In box 440, the material conduit is closed by solidifying a part of the liquid material in the material conduit, particularly through cooling with a cooling medium, more particularly through cooling with a cooling gas. The cooling gas may be a noble gas, particularly argon. If the evaporation crucible is configured for flash evaporation, closing the material conduit quickly stops the material evaporation in the crucible.

In particular, in box 440, the cooling medium may be guided through a cooling passage of a cooling device that surrounds a section of the material conduit and is in thermal contact with the material conduit. Accordingly, a part of the liquid material that is arranged in said section of the material conduit is cooled and solidified, such that the material conduit is blocked by the solidified material.

The cooling gas in the cooling device may have at least one of (i) a temperature of 15° C. or more and 150° C. or less at a position upstream of the cooling passage, (ii) a gas pressure in a range from 2 bar to 20 bar, (iii) a gas velocity in a range from 15 m/s to 50 m/s, and (iv) a mass flow in a range from 10 slm to 50 slm, e.g. about 20 slm.

In box 450, the material conduit is reopened by stopping the supply of the cooling gas through the cooling passage. This may automatically lead to the melting of the solidified material in the material conduit, e.g. when the cooling device is arranged in the hot environment of a heatable enclosure or chamber through which the material conduit extends.

The above embodiments predominantly rely on a cooling gas as a cooling medium for the freeze valve. It is to be noted that also other cooling media can be used in the freeze valve, e.g. for closing a material conduit for another source material, e.g. a source material that is only weakly reactive or non-reactive. For example, a liquid cooling medium may be oil that is even suitable for some reactive materials.

The material conduit is predominantly described herein as a material supply conduit for supplying a liquid material to the material evaporator. It is to be noted that the material supply may also be another material conduit that is connected to the evaporation crucible, e.g. a vapor conduit that guides the evaporated material from the evaporation crucible to the vapor distributor. The vapor conduit can be closed by condensing the evaporated material in the vapor conduit with the cooling device described herein.

While the foregoing is directed to embodiments, other and further embodiments may be devised without departing from the basic scope, and the scope is determined by the claims that follow.

The invention claimed is:

1. An evaporation apparatus, comprising:
   an evaporation crucible for evaporating a liquid material, the liquid material being lithium;
   a heatable enclosure having one or more heating elements, the one or more heating elements heating an inner volume of the heatable enclosure to a temperature of 300° C. or more;
   a material conduit for supplying the liquid material into the evaporation crucible, the material conduit extending at least partially through the heatable enclosure;
   a freeze valve positioned upstream from the evaporation crucible and at least partially in the heatable enclosure, comprising:
      a cooling passage extending axially along the material conduit and surrounding a section of the material conduit, the cooling passage in thermal contact with the material conduit;
      a fluid supply conduit coupled to the cooling passage at a first end of the cooling passage to provide a cooling gas to the cooling passage to cool the liquid material in the material conduit to a temperature below a melting point temperature of the liquid material such that a part of the liquid material solidifies to form a plug that clogs the material conduit; and
      a second fluid conduit coupled to the cooling passage at a second end of the cooling passage, the second end of the cooling passage opposite of and spaced apart from the first end of the cooling passage; and
   a noble gas supply for guiding the cooling gas to the cooling passage for cooling the liquid material with the cooling gas.

2. The evaporation apparatus according to claim 1, wherein the noble gas supply is an argon supply.

3. The evaporation apparatus according to claim 1, wherein the cooling gas supply is configured to guide the cooling gas through the cooling passage with at least one or more of: (i) a gas pressure in a range from 2 bar to 20 bar, (ii) a gas velocity in a range from 15 m/s to 50 m/s, and (iii) a mass flow in a range from 10 slm to 50 slm.

4. The evaporation apparatus according to claim 1, wherein a distance between the cooling passage and the evaporation crucible is 20 cm or less.

5. The evaporation apparatus according to claim 1, further comprising a thermal insulation arrangement that at least partially or entirely encloses the cooling passage for thermally insulating the cooling passage and a section of the material conduit surrounded by the cooling passage from a hot environment inside the heatable enclosure or chamber.

6. The evaporation apparatus according to claim 5, wherein the thermal insulation arrangement comprises one or more heat shields that coaxially extend around the material conduit.

7. The evaporation apparatus according to claim 1, wherein the cooling gas is argon.

8. The evaporation apparatus according to claim 1, wherein the cooling passage extends annularly around a section of the material conduit and a main flow direction of the cooling gas in the cooling passage corresponds to a main flow direction of the liquid material in the material conduit.

9. A vapor deposition apparatus for coating a substrate, comprising:
   the evaporation apparatus according to claim 1;
   a vapor distributor with a plurality of nozzles for directing the liquid material that has been evaporated in the evaporation crucible toward the substrate; and
   a movable substrate support for moving the substrate past the vapor distributor.

10. An evaporation apparatus, comprising:
   an evaporation crucible for evaporating a liquid material, the liquid material being lithium;
   a heatable enclosure having one or more heating elements, the one or more heating elements heating an inner volume of the heatable enclosure to a temperature of 300° C. or more;

a material conduit for supplying the liquid material into the evaporation crucible, the material conduit extending at least partially through the heatable enclosure;
a freeze valve positioned upstream from the evaporation crucible and at least partially in the heatable enclosure, comprising:
  a cooling passage extending helically or spirally along the material conduit and surrounding a section of the material conduit, the cooling passage in thermal contact with the material conduit;
  a fluid supply conduit fluidly coupled to the cooling passage at a first end of the cooling passage to provide a cooling gas to the cooling passage to cool the liquid material in the material conduit to a temperature below a melting point temperature of the liquid material such that a part of the liquid material solidifies to form a plug that clogs the material conduit; and
  a second fluid conduit coupled to the cooling passage at a second end of the cooling passage, the second end of the cooling passage opposite of and spaced apart from the first end of the cooling passage; and
a noble gas supply for guiding the cooling gas to the cooling passage for cooling the liquid material with the cooling gas.

* * * * *